(12) United States Patent
Kim et al.

(10) Patent No.: US 9,173,287 B1
(45) Date of Patent: Oct. 27, 2015

(54) FOLDABLE DISPLAY APPARATUS

(71) Applicant: LG DISPLAY CO., LTD., Seoul (KR)

(72) Inventors: Yong Hee Kim, Seoul (KR); Dal Jae Lee, Seoul (KR); Jun Jae Lee, Paju-si (KR); Su Chan Kwon, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/556,929

(22) Filed: Dec. 1, 2014

(30) Foreign Application Priority Data

Sep. 22, 2014 (KR) .......................... 10-2014-0125843

(51) Int. Cl.
| | |
|---|---|
| *G06F 1/16* | (2006.01) |
| *H05K 5/00* | (2006.01) |
| *H05K 1/02* | (2006.01) |
| *G06F 3/041* | (2006.01) |
| *H05K 7/00* | (2006.01) |
| *E05D 7/00* | (2006.01) |
| *E05F 1/08* | (2006.01) |
| *E05D 3/06* | (2006.01) |
| *H05K 9/00* | (2006.01) |
| *H05K 1/00* | (2006.01) |

(52) U.S. Cl.
CPC ................ *H05K 1/028* (2013.01); *G06F 1/162* (2013.01); *G06F 1/1616* (2013.01); *G06F 1/1618* (2013.01); *G06F 1/1622* (2013.01); *G06F 1/1633* (2013.01); *G06F 1/1637* (2013.01); *G06F 1/1641* (2013.01); *G06F 1/1647* (2013.01); *G06F 1/1652* (2013.01); *H05K 5/0017* (2013.01); *H05K 2201/055* (2013.01)

(58) Field of Classification Search
CPC ..... G06F 1/1616; G06F 1/1618; G06F 1/162; G06F 1/1622; G06F 1/1633; G06F 1/1637; G06F 1/1641; G06F 1/1647; G06F 1/1652; G06F 2203/04102
USPC ............. 361/679.01, 679.04, 679.05, 679.06, 361/679.07, 679.21, 679.22, 679.26, 361/679.27, 679.28, 749; 174/378, 525, 174/254; 16/221, 302, 366; 345/173
See application file for complete search history.

(56) References Cited

U.S. PATENT DOCUMENTS

| | | | |
|---|---|---|---|
| 2010/0232100 A1* | 9/2010 | Fukuma et al. | ........... 361/679.01 |
| 2013/0010405 A1 | 1/2013 | Rothkopf et al. | |
| 2014/0003006 A1* | 1/2014 | Ahn | ............................... 361/749 |

* cited by examiner

*Primary Examiner* — Hoa C Nguyen
*Assistant Examiner* — Binh Tran
(74) *Attorney, Agent, or Firm* — Dentons US LLP

(57) ABSTRACT

Disclosed is a foldable display apparatus which can stably maintain a bending curvature of a folded flexible display, and can maintain a bending area of an unfolded flexible display in a plane state. The foldable display apparatus includes a link assembly connected between first and second housings to support a bending area of a display panel, and configured to guide bending of the bending area. The link assembly includes a plurality of bending guide members configured to support the bending area, a plurality of link parts connected to both ends of each of the plurality of bending guide members, and a plurality of link connecting members respectively provided between the plurality of link parts, and configured to connect two adjacent link parts.

18 Claims, 8 Drawing Sheets

FOLDABLE DISPLAY APPARATUS

CROSS-REFERENCE TO RELATED APPLICATIONS

This application claims the benefit of the Korean Patent Application No. 10-2014-0125843 filed on Sep. 22, 2014, which is hereby incorporated by reference as if fully set forth herein.

BACKGROUND

1. Field of the Invention

The present invention relates to a foldable display apparatus. More particularly, the invention relates to a foldable display apparatus which is bent at a certain curvature or is folded to a plane state.

2. Discussion of the Related Art

Recently, even in portable electronic devices, the demand for a large screen is increasing; and thus, an apparatus including a display unit displaying a large screen has been developed and commercialized by connecting a flat display panel. In particular, foldable display apparatuses using the merits of a flexible display panel which is bendable or foldable provide portable convenience and include a display unit which displays a large screen. The devices are attracting much attention as a next-generation technology of the display field. The foldable display apparatus may be applied to various fields such as TVs and monitors, in addition to portable electronic devices such as mobile communication terminals, electronic notes, e-books, portable multimedia players (PMPs), navigation devices, ultra mobile personal computers (PCs), mobile phones, smartphones, and tablet PCs.

Examples of foldable display apparatuses may include a flexible display apparatus disclosed in U.S. Patent Publication No. 2013/0010405 (hereinafter referred to as a prior art reference).

The flexible display apparatus disclosed in the prior art reference unfolds a flexible display with respect to a hinge having a link structure, thereby providing a large screen.

However, the flexible display apparatus disclosed in the prior art reference cannot stably maintain a bending curvature of a folded flexible display due to an empty space between housings caused by the hinge having the link structure, and cannot maintain a bending display area of an unfolded flexible display in a plane state.

SUMMARY

Accordingly, the present invention is directed to provide a foldable display apparatus that substantially obviates one or more problems due to limitations and disadvantages of the related art.

An aspect of the present invention provides a foldable display apparatus which can stably maintain a bending curvature of a folded flexible display, and can maintain a bending area of an unfolded flexible display in a plane state.

Another aspect of the present invention provides a foldable display apparatus for minimizing a bending stress applied to a display panel.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a foldable display apparatus including a link assembly connected between first and second housings to support a bending area of a display panel, and configured to guide bending of the bending area, wherein the link assembly includes: a plurality of bending guide members configured to support the bending area; a plurality of link parts connected to both ends of each of the plurality of bending guide members; and a plurality of link connecting members respectively provided between the plurality of link parts, and configured to connect two adjacent link parts.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms. It will be further understood that the terms "comprises", "comprising", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "on" should be construed as including a case where one element is provided at a top of another element and moreover a case where a third element is disposed therebetween.

Hereinafter, exemplary embodiments of a foldable display apparatus according to the present invention will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present invention, the detailed description will be omitted.

Figure 1:
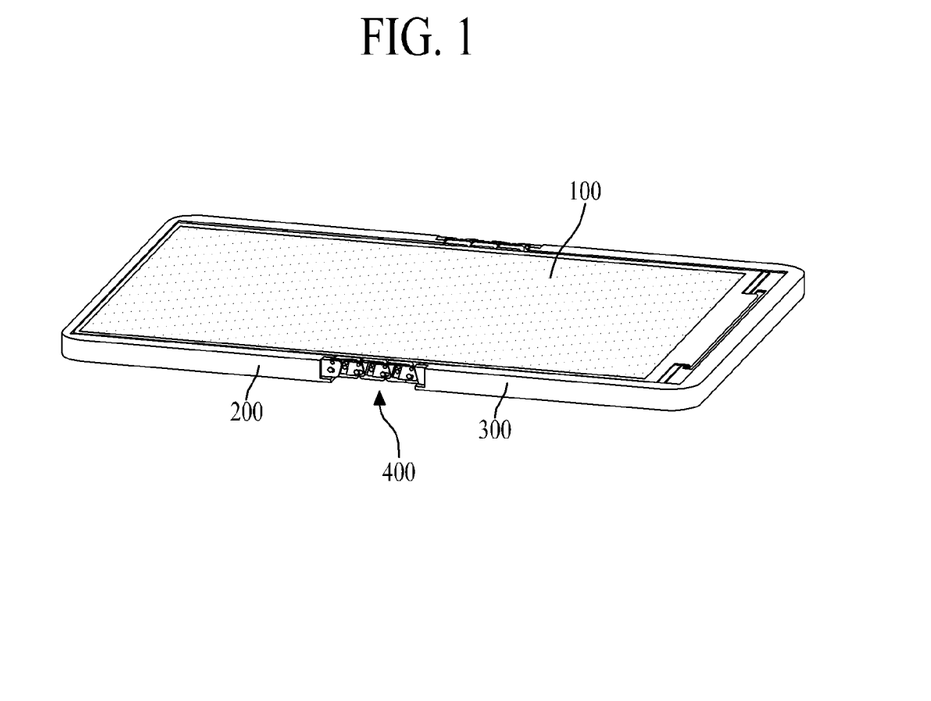
FIG. 1 is a diagram schematically illustrating a foldable display apparatus according to a first embodiment of the present invention.
Figure 2:
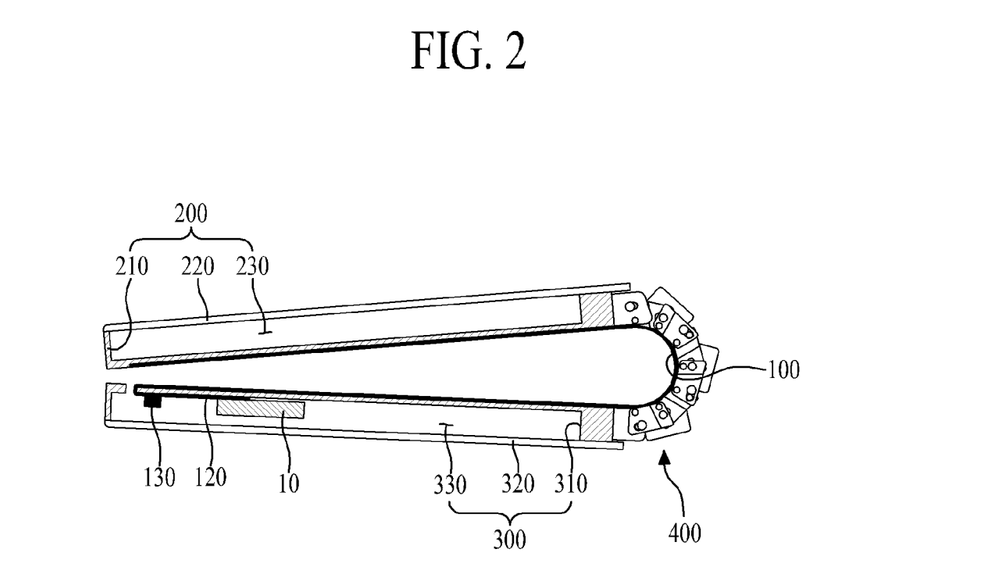
FIG. 2 is a diagram describing a folded display panel according to a first embodiment of the present invention.
Figure 3:
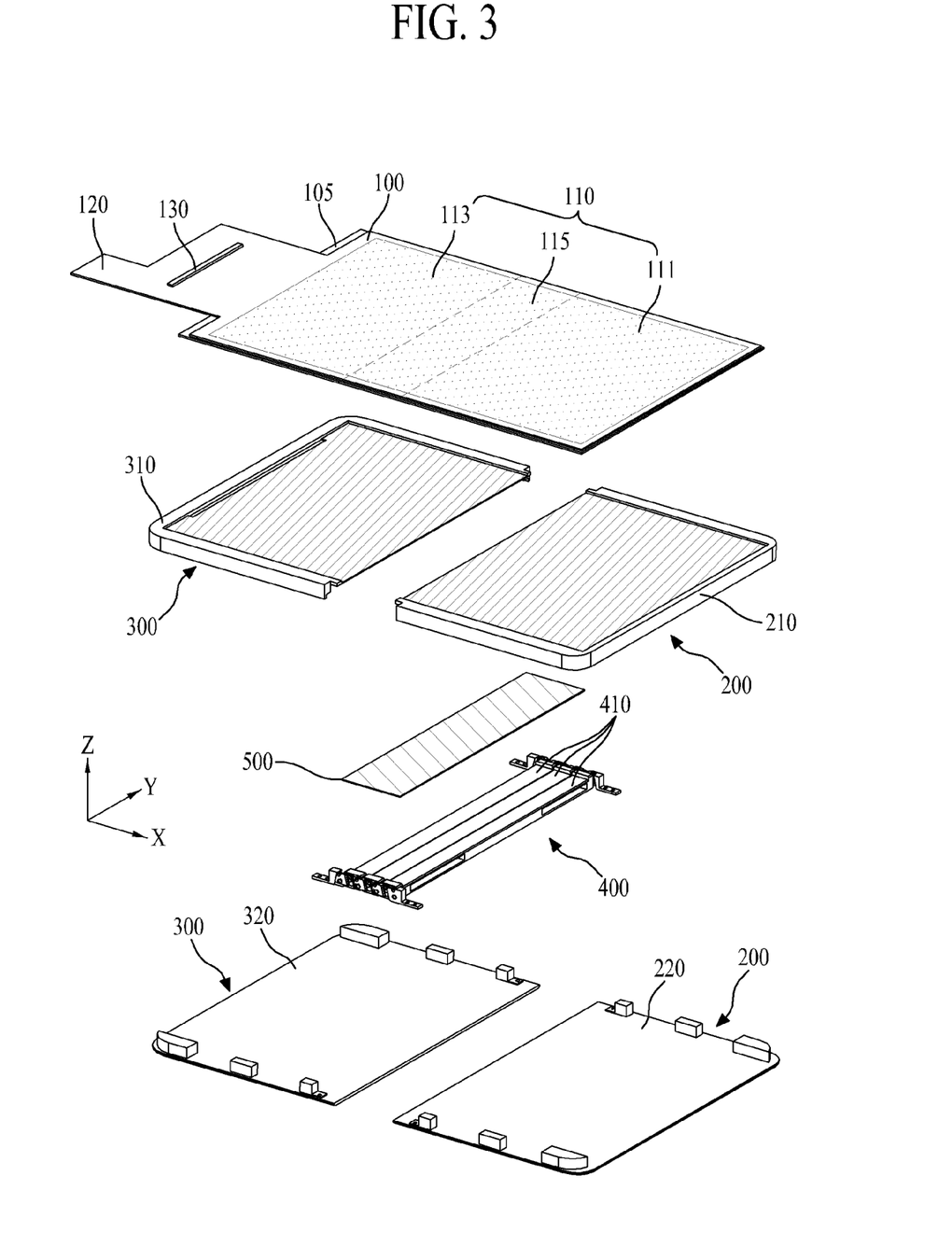
FIG. 3 is an exploded perspective view of the foldable display apparatus of FIG. 1.

FIG. 1 is a diagram schematically illustrating a foldable display apparatus according to a first embodiment of the present invention. FIG. 2 is a diagram describing a folded display panel according to a first embodiment of the present invention. FIG. 3 is an exploded perspective view of the foldable display apparatus of FIG. 1.

Referring to FIGS. 1 to 3, the foldable display apparatus according to the first embodiment of the present invention includes a display panel 100, a first housing 200, a second housing 300, and a link assembly 400.

The display panel 100 may be a flexible display panel using a flexible substrate. For example, the display panel 100 may be a flexible organic light emitting display panel, a flexible electrophoretic display panel, a flexible liquid crystal display panel, or a flexible electro-wetting display panel.

The display panel 100 may include a flexible pixel array substrate, including a pixel array having an active matrix type, and an encapsulating member that protects the pixel array.

The flexible pixel array substrate may be formed of a plastic material or metal foil. For example, the flexible pixel array substrate formed of a plastic material may be formed of at least one selected from polyimide (PI), polyethyleneterephthalate (PET), polyethylenapthanate (PEN), polycarbonate (PC), polynorborneen (PNB), and polyethersulfone (PES).

The pixel array includes a plurality of pixels which are respectively provided in a plurality of pixel areas provided by crossings between a plurality of gate lines and a plurality of data lines. Each of the plurality of pixels includes a display device that displays an image corresponding to an image signal. Here, the display device may be an organic light emitting device, a liquid crystal display device, an electrophoretic device, or an electro-wetting display device.

When the display device is an organic light emitting device or an electrophoretic device, the encapsulating member according to an embodiment is provided on a flexible substrate to cover a pixel array, and may be a flexible encapsulating substrate or an encapsulating layer. When the display device is a liquid crystal display device, the electro-wetting display device, or the electrophoretic device, an encapsulating member according to another embodiment may be a flexible color filter substrate that includes a color filter corresponding to a pixel.

In addition, the display panel 100 may further include a polarizing film attached to the encapsulating member, but the polarizing film may be omitted for a flexibility of the display panel 100.

The foldable display apparatus according to the first embodiment of the present invention may further include a touch screen (not shown) for a user interface using a user's touch. The touch screen may be attached onto the display panel 100, or may be built into the display panel 100 at the same with a process of forming the pixel array.

The display panel 100 includes a display area 110 that displays an image by using the pixel array including the plurality of pixels. The display area 110 may be divided into a first area 111, a second area 113, and a bending area 115.

The first area 111 may be defined as a first area (for example, an upper area) of the display panel 100 disposed at one side of the bending area 110c in the area 110, and the second area 113 may be defined as a second area (for example, a lower area) of the display panel 100 disposed at the other side of the bending area 115 in the display area 110.

When the display panel 100 is unfolded to a plane state, the first area 111, the second area 113, and the bending area 115 constitute one display area 110, and thus, a relatively wide screen is provided.

The display panel 100 includes a signal applying unit 120 which extends from an edge of a first area or a second area to have a certain width and length. A plurality of link lines, connected to a signal line provided in the pixel array, are provided in the signal applying unit 120. The signal applying unit 120 is bent toward a rear surface of the second housing 300 through the second housing 300, and is connected to a system driver 10 which is disposed at the rear surface of the second housing 300. A driving integrated circuit (IC) 130, which drives a pixel provided in the display area 110 on the basis of a pixel driving signal and a data signal which are provided from the system driver 10, is mounted on the signal applying unit 120.

The display panel 100 may be attached to a flexible supporting plate 105. The flexible supporting plate 105 is attached to an entire rear surface of the display panel 100, and maintains the display panel 100, which is flexible, in a flat state. The flexible supporting plate 105 may be omitted depending on a flexible characteristic of the flexible pixel array substrate.

The first housing 200 movably supports a first side rear surface of the display panel 100 which overlaps the first area (i.e., the first area 111) of the display panel 100. To this end, the first housing 200 according to an embodiment may include a first panel supporting part 210 and a first rear cover 220.

The first panel supporting part 210 supports a first side rear surface of the display panel 100, and surrounds a first area side of the display panel 100. Here, the first panel supporting part 210 may be physically coupled to the first side rear surface of the display panel 100 by an adhesive member (not shown) such as a transparent adhesive, an adhesive sheet, or a double-sided tape.

The first rear cover 220 is an outermost rear surface of the foldable display apparatus, and is coupled to a rear surface of the first panel supporting part 210. Also, the first rear cover 220 is coupled to one side of the link assembly 400.

A space 230 is provided between the first panel supporting part 210 and the first rear cover 220, and may be used as an accommodating space in which a system driver 10, various circuits, and a battery which are used to drive the display panel 100 are accommodated.

A peripheral area of the first area 111 of the display panel 100 coupled to the first housing 200 may be covered by a first front cover (not shown), which may be provided in a shape which covers a left edge, a right edge, and an upper edge of the first area 111 except the first area 111 and the bending area 115 adjacent to the first area 111, and may be coupled to the first housing 200.

The second housing 300 supports a second side rear surface of the display panel 100 which overlaps a second area (i.e., the second area 113) of the display panel 100. To this end, the second housing 300 according to an embodiment includes a second panel supporting part 310 and a second rear cover 320.

The second panel supporting part 310 supports a second side rear surface of the display panel 100, and surrounds a second area side of the display panel 100. Here, the second panel supporting part 310 may be physically coupled to the second side rear surface of the display panel 100 by an adhesive member.

The second rear cover 320 is an outermost rear surface of the foldable display apparatus, and is coupled to a rear surface of the second panel supporting part 310. Also, the second rear cover 320 is coupled to the other side of the link assembly 400.

A space 330 is provided between the second panel supporting part 310 and the second rear cover 320, and may be used as an accommodating space in which various circuits for driving the display panel 100 are accommodated.

A peripheral area of the second area 113 of the display panel 100 coupled to the second housing 300 may be covered by a second front cover (not shown), which may be provided in a shape which covers a left edge, a right edge, and a lower edge of the second area 113 except the second area 113 and the bending area 115 adjacent to the second area 113, and may be coupled to the second housing 300.

The link assembly 400 is connected between the first and second housings 200 and 300 to support the bending area 115 of the display panel 100, and guides the bending area 115 which is bent at a certain curvature or is unfolded to a plane state. In this case, in bending the display panel 100, the link assembly 400 bends the display panel 100 in an inner bending manner. Therefore, the display panel 100 is bent in a direction, where the first and second areas 111 and 113 directly face each other, with respect to the bending area 115 according to the inner bending guide of the link assembly 400, and the bent display panel 100 is disposed between the first and second housings 200 and 300 which overlaps each other.

The link assembly 400 according to an embodiment includes a plurality of bending guide members 410, a plurality of link parts 420, a plurality of link connecting members 430, a first link coupling part 440, and a second link coupling part 450.

Figure 4:
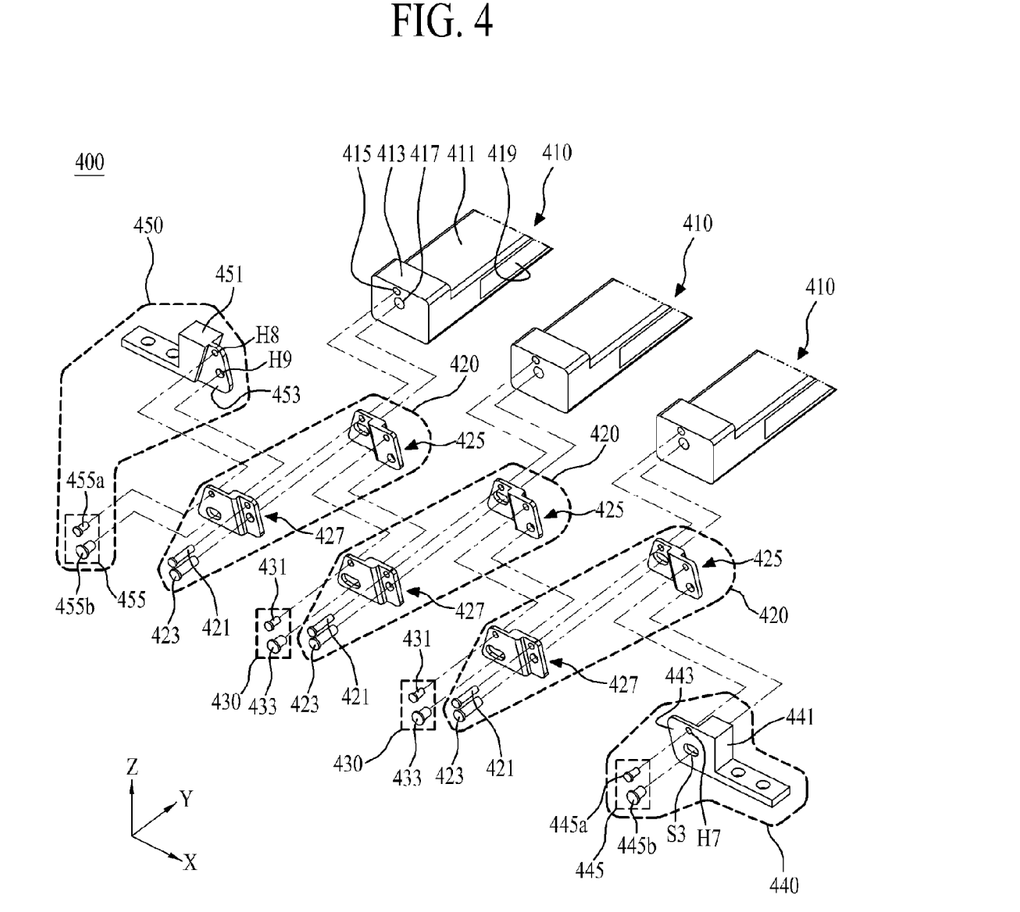
FIG. 4 is an exploded perspective view describing a link assembly of FIG. 3.

The plurality of bending guide members 410 are arranged in parallel under the bending area 115 of the display panel 100. Each of the plurality of bending guide members 410 is rotated at a certain angle in bending the display panel 100, guides the bending area 115 so as to be bent at a certain curvature, and compensates for a bending length of the bending area 115 caused by bending, thereby decreasing a bending stress applied to the display panel 100. Each of the plurality of bending guide members 410 according to an embodiment, as illustrated in FIGS. 3 and 4, includes a supporting bar 411, a guide side wall 413, a first coupling hole 415, and a second coupling hole 417.

The supporting bar 411 is provided in a tetragonal cross-sectional bar shape, and supports a rear surface of the display panel 100 which overlaps the bending area 115 of the display panel 100. The supporting bar 411 supports the display panel 100 without being physically coupled to the display panel 100, for folding and unfolding the bending area 115. Therefore, the supporting bar 411 prevents the bending area 115, which is unfolded to a plane state, from being recessed by an external force, and maintains the unfolded display panel 100 in the plane state.

In addition, an upper corner of the supporting bar 411 may be rounded at a certain curvature with respect to a length direction of the supporting bar 411 so as to prevent a scratch and a local bending stress from being caused by a contact between the upper corner of the supporting bar 411 and the rear surface of the display panel 100 in bending the display panel 100. A tunnel part 419 is provided at the supporting bar 411, and passes through the supporting bar 411 along a width direction X of the supporting bar 411. The tunnel part 419 acts as a path through which a cable and/or a signal transfer film for signal transfer between the signal applying unit 120 of the display panel 100 and the system driver 10 pass(s).

The guide side wall 413 is provided at each of both edges of the supporting bar 411 to have a certain height with respect to a length direction X of the display panel 100, and prevents a long side of the display panel 100 from being exposed to the outside.

The first coupling hole 415 is provided at each of both sides (or short sides) of the supporting bar 411 with respect to the length direction X of the display panel 100. A corresponding link connecting member 430 is coupled to the first coupling hole 415.

The second coupling hole 417 is provided at each of both sides of the supporting bar 411 to be separated from the first coupling hole 415 by a certain distance. Here, a distance between the first coupling hole 415 and the second coupling hole 417 is set to correspond to a rotation angle of the supporting bar 411 based on a bending curvature of the bending area 115. A corresponding ling connecting member 430 is coupled to the second coupling hole 417.

Each of the plurality of link parts 420 is connected to both ends of each of the plurality of bending guide members 410, and rotates a corresponding bending guide member 410. Each of the plurality of link parts 420 according to an embodiment may include a first shaft member 421, a second shaft member 423, a first link 425, and a second link 427.

The first shaft member 421 of each of the plurality of link parts 420 passes through the first and second links 425 and 427, and is inserted into or coupled to and fixed to the first coupling hole 415 which is provided at the supporting bar 411 of the bending guide member 410. The first shaft member 421 acts as a rotation shaft which supports the first and second links 425 and 427 and rotates the first link 425. For example, the first shaft member 421 may be a pin or a screw. Here, when the first shaft member 421 is a pin, the pin may be inserted into the first coupling hole 415 in a forced insertion manner, and fixed to a side of the supporting bar 411. When the first shaft member 421 is a screw, the screw may include a cylindrical part, which does not include a screw thread so as to enable the first link 425 to rotate, and a screw thread part which includes a screw thread. The screw may be screw-coupled to the first coupling hole 415 through the screw thread part, and fixed to the side of the supporting part 411.

The second shaft member 423 of each of the plurality of link parts 420 passes through the first and second links 425 and 427, and is inserted into or coupled to the second coupling hole 417 which is provided at the supporting bar 411 of the bending guide member 410. The second shaft member 423 supports the first and second links 425 and 427, binds rotation of the second link 427, and guides rotation of the first link 425. For example, the second shaft member 423 may be a pin or a screw identically to the first shaft member 421.

The first link 425 of each of the plurality of link parts 420 is supported by the first and second shaft members 421 and 423, and rotates with the first shaft member 421 as a rotation axis.

Figure 5:
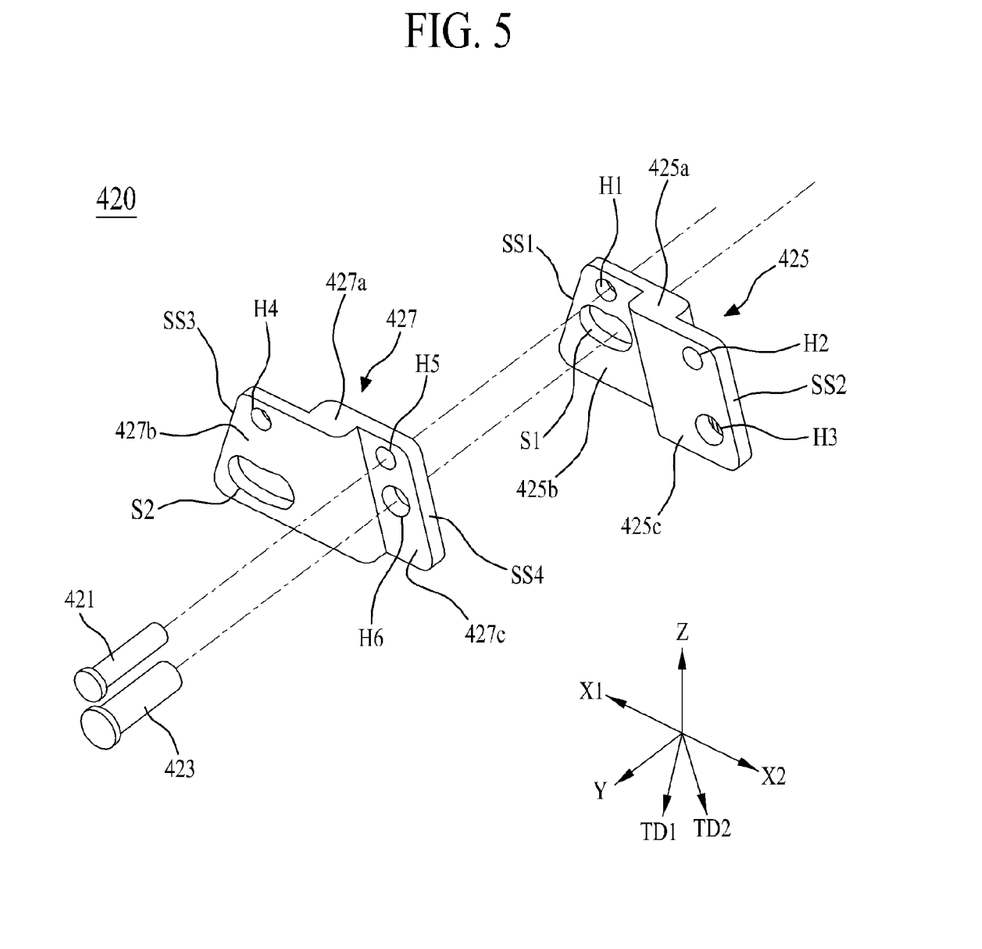
FIG. 5 is an exploded perspective view describing a configuration of each link part illustrated in FIG. 4.

The first link 425 of each of the plurality of link parts 420 according to an embodiment, as illustrated in FIGS. 4 and 5, may include a first link body 425a, a first wing part 425b, and a second wing part 425c. The first link 425 has an S-shape, instead of a plate shape, due to the first and second wing parts 425b and 425c, and has relatively greater rigidity than the plate shape.

The first link body 425a may be provided in a bar shape, and particularly, may be inclined at a certain angle along a first slope direction TD1 with respect to a thickness (or height) direction of the display panel 100.

The first wing part 425b is provided to protrude in a first direction X1 from an upper side of the first link body 425a so as to be parallel to a side of the bending guide member 410, with respect to a width direction Y of the display panel 100. The first wing part 425b includes a first hole H1, through which the first shaft member 421 passes, and a first slot S1 through which the second shaft member 423 passes. In this case, the first slot S1 is provided in a curved shape having a curvature based on a rotation angle of the first link 425 so that the first link 425 rotates at a certain angle in bending the display panel 100, and guides moving of the second shaft member 423. Therefore, the first link 425 rotates with the first shaft member 421 as a rotation axis, and a maximum rotation angle is limited by the second shaft member 423 inserted into the first slot S1. Also, the second shaft member 423 rotates a corresponding bending guide member 410 according to rotation of the first link 425, and simultaneously moves the corresponding bending guide member 410 by a length of the first slot S1.

The second wing part 425c is provided to protrude in a second direction X2, which is opposite to the first direction X1, from a lower side of the first link body 425a so as to be parallel to a side of the bending guide member 410. The second wing part 425c includes second and third holes H2 and H3 through which the link connecting member 430 passes. Here, the third hole H3 may be provided in a slot shape having a certain curvature.

The second link 427 of each of the plurality of link parts 420 according to an embodiment is supported by the first and second shaft members 421 and 423, and rotates with the first shaft member 421 as a rotation axis. In this case, the second link 427 rotates by a moving distance of the second shaft member 423 which is moved in the first slot S1 of the first link 425. The second link 427 of each of the plurality of link parts 420 according to an embodiment, as illustrated in FIGS. 4 and 5, may include a second link body 427a, a third wing part 427b, and a fourth wing part 427c. The second link 427 has an S-shape, instead of a plate shape, due to the third and fourth wing parts 427b and 427c, and has relatively greater rigidity than the plate shape.

The second link body 427a may be provided in a bar shape, and particularly, may be inclined at a certain angle along the first slope direction TD1 with respect to the thickness (or height) direction of the display panel 100.

The third wing part 427b is provided to protrude in the first direction X1 from a lower side of the second link body 475a so as to be parallel to the first wing part 425b, with respect to the width direction Y of the display panel 100. The third wing part 427b includes a fourth hole H4 and a second slot S2 through which the link connecting member 430 passes. In this case, the second slot S2 is provided in a curved shape having a curvature based on a rotation angle of the second link 427 so that the second link 427 rotates at a certain angle in bending the display panel 100. The third connecting part 427b is cross connected to the second wing part 425c, which is provided at the first link 425 of the link part 420 adjacent thereto, through the link connecting member 430, and is supported by the link connecting member 430.

The fourth wing part 427c is provided to protrude in the second direction X2 from an upper side of the second link body 427a so as to overlap the first wing part 425b in parallel with the first wing part 425b. The fourth wing part 427c includes a fifth hole H5, through which the first shaft member 421 passes, and a sixth hole H6 through which the second shaft member 423 passes. Here, the sixth hole H6 may be provided in a slot shape having a certain curvature. The fourth wing part 427c is cross connected to the first wing part 425b, which is provided at the first link 425 of the link part 420 adjacent thereto, through the first and second shaft members 421 and 423, and is supported by the first and second shaft members 421 and 423.

The first and second links 425 and 427 are cross connected to each other by the first and second shaft members 421 and 423. That is, the first shaft member 421 passes through the fifth hole H5 of the fourth wing part 427c and the first hole H1 provided at the first wing part 425b, and is coupled to the first coupling hole 415, and the second shaft member 423 passes through the sixth hole H6 of the fourth wing part 427c and the first slot S1 provided at the first wing part 425b, and is coupled to the second coupling hole 417. Therefore, the first wing part 425b of the first link 425 overlaps the fourth wing part 427c of the second link 427 to face each other, and accordingly, the first link 425 is disposed across the second link 427.

In order for the first and second links 425 and 427 (which are cross connected to each other) to smoothly rotate and in order to limit a maximum rotation angle, the first and second link bodies 425a and 427a may be provided to be inclined along the first slope direction TD1, and an outer surface of each of the first and second links 425 and 427 may be an inclined surface. Therefore, rotation of the first link 425 may be bound by a contact between an outer surface of the fourth wing part 427c and an inclined surface of the first link body 425a, or bound by a contact between an outer surface of the third wing part 427b and an inclined surface of the second link body 427a. To this end, the first link 425 may include a first slope surface SS1, which is provided at an outer surface of the first wing part 425b to be inclined along a second slope direction TD2 intersecting the first slope direction TD1, and a second slope surface SS2 which is provided at an outer surface of the second wing part 425c to be inclined along the first slope direction TD1. Likewise, the second link 427 may include a third slope surface SS3, which is provided at an outer surface of the third wing part 427b to be inclined along the second slope direction TD2 intersecting the first slope direction TD1, and a fourth slope surface SS4 which is provided at an outer surface of the fourth wing part 427c to be inclined along the first slope direction TD1. Therefore, when seen from a side of the display panel 110, each of the first and second links 425 and 427 has a trapezoid shape.

Referring again to FIGS. 3 to 5, each of the plurality of link connecting members 430 connects two link parts 420 which are provided between the plurality of link parts 420 and are adjacent to each other, so that the plurality of link parts 420 move while rotating at a certain angle. Each of the plurality of link connecting parts 430 according to an embodiment includes third and fourth shaft members 431 and 433.

The third and fourth shaft members 431 and 433 support a second link 427 of a front-end link part 420 of two adjacent link parts 420 and a first link 425 of a rear-end link part 420 so as to be connected to each other.

The third shaft member 431 supports the third wing part 427b, which is provided at the second link 427 of the front-end link part 420, and the second wing part 425c, which is provided at the first link 425 of the rear-end link part 420, so as to be connected to each other. That is, the third shaft member 431 is inserted into the fourth hole H4, which is provided at the third wing part 427b of the front-end link part 420, and the second hole H2 which is provided at the second wing part 425c of the rear-end link part 420, and rotatably supports the second link 427 of the front-end link part 420 and the first link 425 of the rear-end link part 420. The third shaft member 431 may be configured with a supporting pin, a rivet, or a bolt and a nut.

The fourth shaft member 433 is inserted into the second slot S2, which is provided at the third wing part 427b of the front-end link part 420, and the third hole H3 which is provided at the second wing part 425c of the rear-end link part 420, supports the second link 427 of the front-end link part 420 and the first link 425 of the rear-end link part 420, and moves by a length of the second slot S2 according to the guide of the second slot S2. Therefore, the second link 427 of each link part 420 rotates with the third shaft member 431 as a rotation axis, and a maximum rotation angle is limited by the fourth shaft member 433 inserted into the second slot S2. Also, the fourth shaft member 433 rotates a corresponding bending guide member 410 according to rotation of the second link 427, and simultaneously moves the corresponding bending guide member 410 by a length of the second slot S2. The fourth shaft member 433 may be configured with a supporting pin, a rivet, or a bolt and a nut.

As described above, each of the plurality of link connecting members 430 is connected between the plurality of link parts 420, and thus, the first and second links 425 and 427 of each of the plurality of link parts 420 are connected to each other through each of the first to fourth shaft members 421, 423, 431 and 433 in a crossing type (or a chain type).

The first link coupling part 440 is connected to a first link part 420 adjacent to the first housing 200 among the plurality of link parts 420, and is coupled to the first housing 200. That is, one side of the first link coupling part 440 is coupled to the first housing 200, and the other side of the first link coupling part 440 is rotatably connected to the second wing part 425c which is provided at the first link 425 of the first link part 420. The first link coupling part 440 according to an embodiment includes a first coupling body 441, a fifth wing part 443, and a first link supporting member 445.

The first coupling body 441 is coupled to the first housing 200 which contacts the link assembly 400. For example, the first coupling body 441 may be coupled to inner both edges of the first rear cover 220, which contacts the link assembly 400, by a coupling member such as a screw, but the present embodiment is not limited thereto. As another example, the first coupling body 441 may be coupled to an inner wall of the first panel supporting part 210 which contacts the link assembly 400.

The fifth wing part 443 protrudes from an inner side of the first coupling body 441 to the first link part 420 with respect to the length direction X of the display panel 100, and is connected to the first link 425 of the first link part 420 through the first link supporting member 445. The fifth wing part 443 includes a seventh hole H7 and a third slot S3 into which the first link supporting member 445 is inserted. Here, a length of the third slot S3 may be the same as a half of the first slot S1, for maintaining a bending curvature of the display panel 100. In addition, an inner side of the fifth wing part 443 may be inclined identically to the second link body 427a.

The first link supporting member 445 connects and supports the fifth wing part 443 and the first link 425 of the first link part 420, and includes fifth and sixth shaft members 445a and 445b.

The fifth shaft member 445a supports the fifth wing part 443 and the first link 425 of the first link part 420 so as to be connected to each other. That is, the fifth shaft member 445a passes through the seventh hole H7 which is provided at the fifth wing part 443, is inserted into the second hole H2 which is provided at the fifth wing part 443, and rotatably supports the fifth wing part 443 and the second wing part 425c of the first link 425. The fifth shaft member 445a may be configured with a supporting pin, a rivet, or a bolt and a nut.

The sixth shaft member 445b supports the fifth wing part 443 and the first link 425 of the first link part 420 so as to be connected to each other, and moves by a length of the third slot S3 according to the guide of the third slot S3. That is, the sixth shaft member 445b passes through the third slot S3 which is provided at the fifth wing part 443, is inserted into the third hole H3 which is provided at the second wing part 425c of the first link part 420, and rotatably supports the fifth wing part 443 and the second wing part 425c of the first link 425. The sixth shaft member 445b may be configured with a supporting pin, a rivet, or a bolt and a nut.

The second link coupling part 450 is connected to a last link part 420 adjacent to the second housing 300 among the plurality of the link parts 420, and is coupled to the second housing 300. That is, one side of the second link coupling part 450 is coupled to the second housing 300, and the other side of the second link coupling part 450 is rotatably connected to the third wing part 427b which is provided at the second link 427 of the last link part 420. The second link coupling part 450 according to an embodiment includes a second coupling body 451, a sixth wing part 453, and a second link supporting member 455.

The second coupling body 451 is coupled to the second housing 300 which contacts the link assembly 400. For example, the second coupling body 451 may be coupled to inner both edges of the second rear cover 320, which contacts the link assembly 400, by a coupling member such as a screw, but the present embodiment is not limited thereto. As another example, the second coupling body 451 may be coupled to an inner wall of the second panel supporting part 310 which contacts the link assembly 400.

The sixth wing part 453 protrudes from an inner side of the second coupling body 451 to the last link part 420 with respect to the length direction X of the display panel 100, and is connected to the second link 427 of the last link part 420 through the second link supporting member 455. The sixth wing part 453 includes eighth and ninth holes H8 and H9 into which the second link supporting member 455 is inserted. In addition, an inner side of the sixth wing part 453 may be inclined identically to the second link body 427a.

The second link supporting member 455 connects and supports the sixth wing part 453 and the second link 427 of the last link part 420, and includes seventh and eighth shaft members 455a and 455b.

The seventh shaft member 455a supports the sixth wing part 453 and the second link 427 of the last link part 420 so as to be connected to each other. That is, the seventh shaft member 455a passes through the fourth hole H4 of the third wing part 427c which is provided at the second link 427 of the last link part 420, is inserted into the eighth hole H8 of the sixth wing part 453, and rotatably supports the sixth wing part 453 and the third wing part 427c of the second link 427. The seventh shaft member 455a may be configured with a supporting pin, a rivet, or a bolt and a nut.

The eighth shaft member 455b supports the sixth wing part 453 and the second link 427 of the last link part 420 so as to be connected to each other. That is, the eighth shaft member 455b passes through the second slot S2 which is provided at the third wing part 427c of the last link part 420, is inserted into the ninth hole H9 of the sixth wing part 453, and rotatably supports the sixth wing part 453 and the third wing part 427c of the second link 427. The eighth shaft member 455b may be configured with a supporting pin, a rivet, or a bolt and a nut.

In the link assembly 400, a shaft member which supports each of the links 425 and 427 restrictively moves by a length of each of the slots S1 to S3 according to the display panel 100 being folded or unfolded, and thus, each bending guide member 410 moves while rotating, and is unfolded to a plane state or is folded at a certain curvature.

That is, in each bending guide member 410 of the link assembly 400, when the display panel 100 is unfolded to a plane state as illustrated in FIG. 1, the links 425 and 427 overlaps each other to be crossed according to moving of a shaft member, and thus are unfolded to the plane state, thereby allowing the bending area 115 of the display panel 100 to be unfolded to the plane state. Also, in each bending guide member 410 of the link assembly 400, as illustrated in FIG. 2, when the display panel 100 is bent (or folded) in the inner bending manner, each of the links 425 and 427 rotates at a certain angle according to moving of the shaft member, is simultaneously expanded and moved by the length of each of the slots S1 to S3, and is inner-bent at a certain curvature, thereby allowing the bending area 115 of the display panel 100 to be bent at a certain curvature.

Therefore, in the link assembly 400, when the display panel 100 is folded and unfolded, the links 425 and 427 overlaps each other to be crossed or is expanded and moved, and thus, each bending guide member 410 rotates, thereby compensating for a length change of the bending area 115 of the display panel 100. Therefore, a bending stress applied to the bending area 115 of the display panel 100 is minimized, thereby enhancing a reliability of the display panel 100.

The foldable display apparatus according to the first embodiment of the present invention may further include a panel protecting member 500 which is provided between the display panel 100 and the link assembly 400.

When the display panel 100 is repeatedly folded and unfolded, the panel protecting member 500 protects the rear surface of the display panel 100 from a scratch and the like caused by movement of the link assembly 400 having a rigid material, and buffers an impact applied to the display panel 100. To this end, the panel protecting member 500 may be provided of a flexible material which may be bent along with the display panel 100. The panel protecting member 500 may be attached to one of the plurality of bending guide bars 410, and for example, may be attached to a top of a bending guide bar which is disposed at a middle position.

Figure 6:
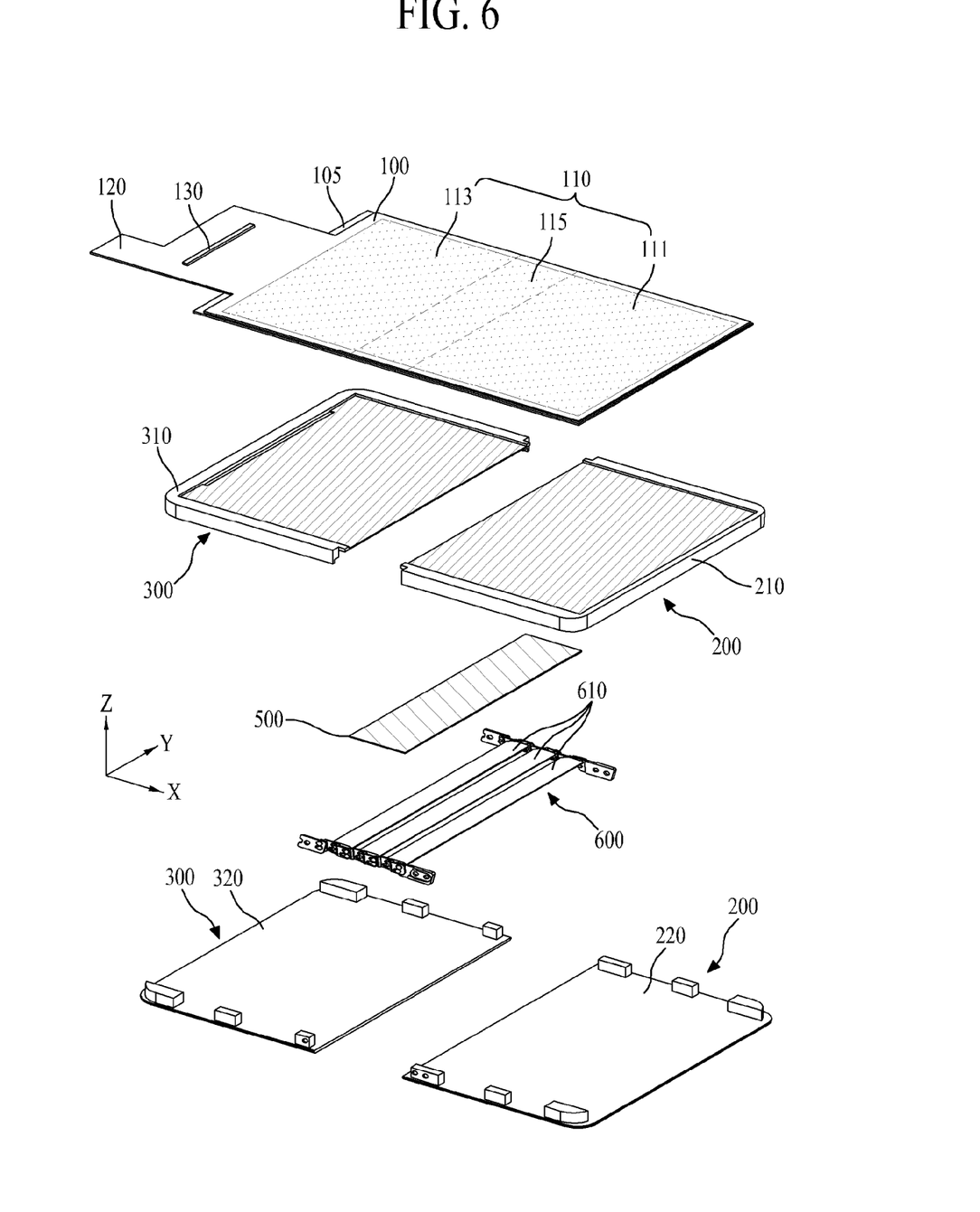
FIG. 6 is an exploded perspective view describing a foldable display apparatus according to a second embodiment of the present invention.

FIG. 6 is an exploded perspective view describing a foldable display apparatus according to a second embodiment of the present invention, and illustrates that a configuration of the link assembly illustrated in FIGS. 1 to 5 is changed for bending the display panel in an outer bending manner. In describing the second embodiment of the present invention, the following description will focus on elements which differ from the first embodiment.

Figure 7:
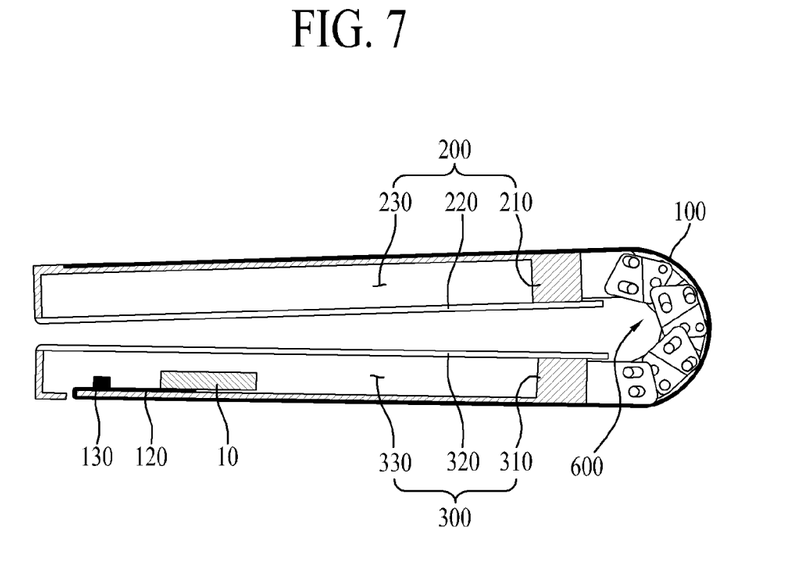
FIG. 7 is a diagram describing a folded display panel according to a second embodiment of the present invention.

Referring to FIG. 6, a link assembly 600 is connected between the first and second housings 200 and 300 to support the bending area 115 of the display panel 100, and guides the bending area 115 which is bent at a certain curvature or is unfolded to a plane state. In this case, in bending the display panel 100, as illustrated in FIG. 7, the link assembly 600 bends the display panel 100 in the outer bending manner. Therefore, the display panel 100 is bent in a direction, where the first and second areas 111 and 113 do not directly face each other, with respect to the bending area 115 according to the bending guide of the link assembly 600, and the bent display panel 100 is exposed to the outside without being covered by the first housing 200, the second housing 300, and the link assembly 600.

Figure 8:
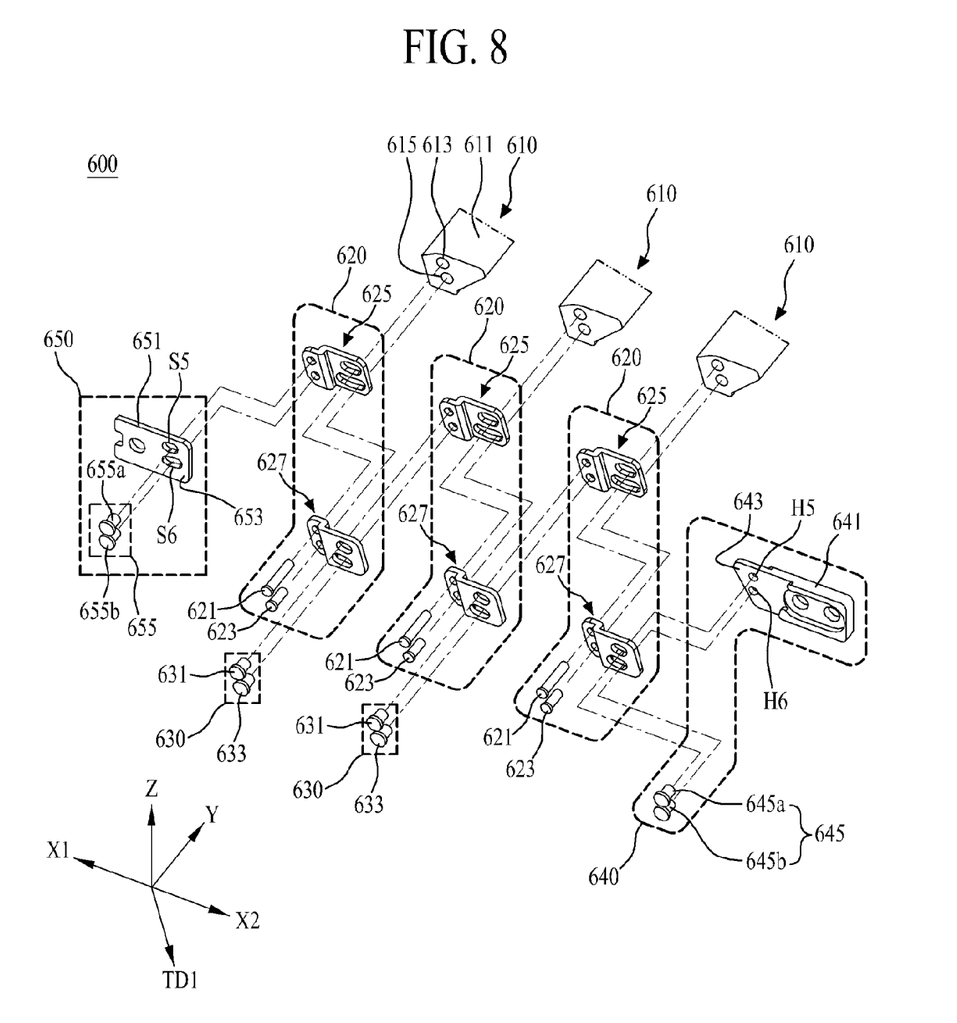
FIG. 8 is an exploded perspective view describing a link assembly of FIG. 6.

The link assembly 600 according to an embodiment, as illustrated in FIG. 8, includes a plurality of bending guide members 610, a plurality of link parts 620, a plurality of link connecting members 630, a first link coupling part 640, and a second link coupling part 650.

The plurality of bending guide members 610 are arranged in parallel under the bending area 115 of the display panel 100. Each of the plurality of bending guide members 610 is rotated at a certain angle in bending the display panel 100, guides the bending area 115 so as to be bent at a certain curvature, and compensates for a bending length of the bending area 115 caused by bending, thereby decreasing a bending stress applied to the display panel 100.

Each of the plurality of bending guide members 610 according to an embodiment includes a supporting bar 611, a first coupling hole 613, and a second coupling hole 615.

The supporting bar 611 is provided in a tetragonal cross-sectional bar shape, and supports a rear surface of the display panel 100 which overlaps the bending area 115 of the display panel 100. The supporting bar 611 supports the display panel 100 without being physically coupled to the display panel 100, for folding and unfolding the bending area 115. Therefore, the supporting bar 411 prevents the bending area 115, which is unfolded to a plane state, from being recessed by an external force, and maintains the unfolded display panel 100 in the plane state.

In addition, the supporting bar 611 may include a guide side wall (not shown) which is provided at each of both edges of the supporting bar 611 to have a certain height with respect to the length direction X of the display panel 100. The guide side wall prevents a long side of the display panel 100 from being exposed to the outside.

In addition, an upper corner of the supporting bar 611 may be rounded at a certain curvature with respect to a length direction of the supporting bar 611 so as to prevent a scratch and a local bending stress from being caused by a contact between the upper corner of the supporting bar 611 and the rear surface of the display panel 100 in bending the display panel 100. A tunnel part (not shown) is provided at the supporting bar 611, and passes through the supporting bar 611 along a width direction X of the supporting bar 611. The tunnel part acts as a path through which a cable and/or a signal transfer film for signal transfer between the signal applying unit 120 of the display panel 100 and the system driver 10 pass(s).

The firs coupling hole 613 is provided at each of both sides (or short sides) of the supporting bar 611 with respect to the length direction X of the display panel 100. A corresponding link connecting member 630 is coupled to the first coupling hole 613.

The second coupling hole 615 is provided at each of both sides of the supporting bar 611 to be separated from the first coupling hole 613 by a certain distance. Here, a distance between the first coupling hole 613 and the second coupling hole 615 is set to correspond to a rotation angle of the supporting bar 611 based on a bending curvature of the bending area 115. A corresponding ling connecting member 630 is coupled to the second coupling hole 615.

Each of the plurality of link parts 620 is connected to both ends of each of the plurality of bending guide members 610, and rotates a corresponding bending guide member 610. Each of the plurality of link parts 620 according to an embodiment may include a first shaft member 621, a second shaft member 623, a first link 625, and a second link 627.

The first shaft member 621 of each of the plurality of link parts 620 passes through the first and second links 625 and 627, and is inserted into or coupled to and fixed to the first coupling hole 613 which is provided at the supporting bar 611 of the bending guide member 610. The first shaft member 621 acts as a rotation shaft which supports the first and second links 625 and 627 and rotates the first link 625. For example, the first shaft member 621 may be a pin or a screw. Here, when the first shaft member 621 is a pin, the pin may be inserted into the first coupling hole 615 in a forced insertion manner, and fixed to a side of the supporting bar 611. When the first shaft member 621 is a screw, the screw may include a cylindrical part, which does not include a screw thread so as to enable the first link 625 to rotate, and a screw thread part which includes a screw thread. The screw may be screw-coupled to the first coupling hole 615 through the screw thread part, and fixed to the side of the supporting part 611.

The second shaft member 623 of each of the plurality of link parts 620 passes through the first and second links 625 and 627, and is inserted into or coupled to the second coupling hole 615 which is provided at the supporting bar 611 of the bending guide member 610. The second shaft member 623 supports the first and second links 625 and 627, binds rotation of the second link 627, and guides rotation of the first link 625. For example, the second shaft member 623 may be a pin or a screw identically to the first shaft member 621.

The first link 625 of each of the plurality of link parts 620 is supported by the first and second shaft members 621 and 623, and rotates with the first shaft member 621 as a rotation axis.

Figure 9:
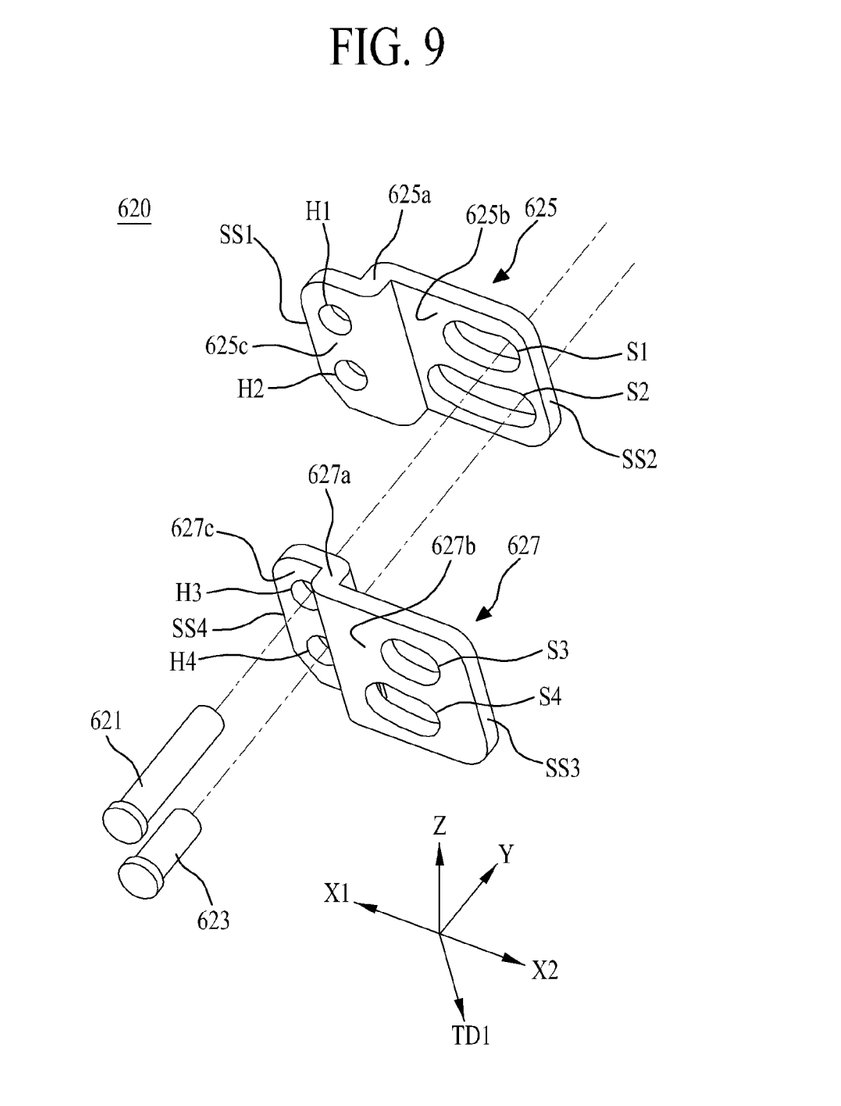
FIG. 9 is an exploded perspective view describing a configuration of each link part illustrated in FIG. 8.

The first link 625 of each of the plurality of link parts 620 according to an embodiment, as illustrated in FIGS. 6 and 9, may include a first link body 625a, a first wing part 625b, and a second wing part 625c. The first link 625 has an S-shape, instead of a plate shape, due to the first and second wing parts 625b and 625c, and has relatively greater rigidity than the plate shape.

The first link body 625a may be provided in a bar shape, and particularly, may be inclined at a certain angle along a first slope direction TD1 with respect to a thickness (or height) direction of the display panel 100.

The first wing part 625b is provided to protrude in a second direction X2 from an upper side of the first link body 625a so as to be parallel to a side of the bending guide member 610, with respect to a width direction Y of the display panel 100. The first wing part 625b includes a first slot S1, through which the first shaft member 621 passes, and a second slot S2 through which the second shaft member 623 passes. In this case, the first and second slots S1 and S2 are provided in a curved shape having a curvature based on a rotation angle of the first link 625 so that the first link 625 rotates at a certain angle in bending the display panel 100, and guides moving of the first and second shaft members 621 and 623. In this case, lengths of the first and second slots S1 and S2 differ based on a rotation angle of the first link 625, and the first slot S1 may be shorter in length than the second slot S2. Therefore, the first link 625 rotates with the first shaft member 621 as a rotation axis, and a maximum rotation angle is limited by the first and second shaft members 621 and 623 respectively inserted into the first and second slots S1 and S2. Also, the second shaft member 623 rotates a corresponding bending guide member 610 according to rotation of the first link 625, and simultaneously moves the corresponding bending guide member 610 by a length of the second slot S2.

The second wing part 625c is provided to protrude in a first direction X1, which is opposite to the second direction X2, from a lower side of the first link body 625a so as to be parallel to a side of the bending guide member 610. The second wing part 625c includes first and second holes H1 and H2 through which the link connecting member 630 passes.

The second link 627 of each of the plurality of link parts 620 according to an embodiment is supported by the first and second shaft members 621 and 623, and rotates with the first shaft member 621 as a rotation axis. In this case, the second link 627 rotates by a moving distance of the second shaft member 623 which is moved in the second slot S2 of the first link 625. The second link 627 of each of the plurality of link parts 620 according to an embodiment, as illustrated in FIGS. 8 and 9, may include a second link body 627a, a third wing part 627b, and a fourth wing part 627c. The second link 627 has an S-shape, instead of a plate shape, due to the third and fourth wing parts 627b and 627c, and has relatively greater rigidity than the plate shape.

The second link body 627a may be provided in a bar shape, and particularly, may be inclined at a certain angle along the first slope direction TD1 with respect to the thickness (or height) direction of the display panel 100.

The third wing part 627b is provided to protrude in the first direction X1 from a lower side of the second link body 675a so as to be parallel to the first wing part 625b, with respect to the width direction Y of the display panel 100. The third wing part 627b includes a third slot S3 and a fourth slot S4 through which the link connecting member 630 passes. In this case, the third slot S3 and the fourth slot S4 may be provided in a curved shape having a curvature based on a rotation angle of the second link 627 so that the second link 627 rotates at a certain angle in bending the display panel 100. In this case, lengths of the third slot S3 and the fourth slot S4 differ based on a rotation angle of the second link 627, and the third slot S3 may be shorter in length than the fourth slot S4. The third connecting part 627b is cross connected to the first wing part 625b, which is provided at the first link 625 of the link part 620 adjacent thereto, through the link connecting member 630, and is supported by the link connecting member 630.

The fourth wing part 627c is provided to protrude in the first direction X1 from an upper side of the second link body 627a so as to overlap the first wing part 625b in parallel with the first wing part 625b. The fourth wing part 627c includes a third hole H3, through which the first shaft member 621 passes, and a fourth hole H4 through which the second shaft member 623 passes. The fourth wing part 627c is cross connected to the first wing part 625b, which is provided at the first link 625 of the link part 620 adjacent thereto, through the first and second shaft members 621 and 623, and is supported by the first and second shaft members 621 and 623.

The first and second links 625 and 627 are cross connected to each other by the first and second shaft members 621 and 623. That is, the first shaft member 621 passes through the third hole H3 of the fourth wing part 627c and the first slot S1 provided at the first wing part 625b, and is coupled to the first coupling hole 615, and the second shaft member 623 passes through the fourth hole H4 of the fourth wing part 627c and the second slot S2 provided at the first wing part 625b, and is coupled to the second coupling hole 617. Therefore, the first wing part 625b of the first link 625 overlaps the fourth wing part 627c of the second link 627 to face each other, and accordingly, the first link 625 is disposed across the second link 627.

In order for the first and second links 625 and 627 (which are cross connected to each other) to smoothly rotate and in order to limit a maximum rotation angle, the first and second link bodies 625a and 627a may be provided to be inclined along the first slope direction TD1, and an outer surface of each of the first and second links 625 and 627 may be an inclined surface. Therefore, rotation of the first link 625 may be bound by a contact between an outer surface of the fourth wing part 627c and an inclined surface of the first link body 625a, or bound by a contact between an outer surface of the third wing part 627b and an inclined surface of the second link body 627a. To this end, the first link 625 may include a first slope surface SS1, which is provided at an outer surface of the first wing part 625b to be inclined along the first slope direction TD1, and a second slope surface SS2 which is provided at an outer surface of the second wing part 625c to be inclined along the first slope direction TD1. Likewise, the second link 627 may include a third slope surface SS3, which is provided at an outer surface of the third wing part 627b to be inclined along the first slope direction TD1, and a fourth slope surface SS4 which is provided at an outer surface of the fourth wing part 627c to be inclined along the first slope direction TD1. Therefore, when seen from a side of the display panel 110, each of the first and second links 625 and 627 has a parallelogram shape which is inclined in the first slope direction TD1.

Referring again to FIGS. 6 to 9, each of the plurality of link connecting members 630 connects two link parts 620 which are provided between the plurality of link parts 620 and are adjacent to each other, so that the plurality of link parts 620 move while rotating at a certain angle. Each of the plurality of link connecting parts 630 according to an embodiment includes third and fourth shaft members 631 and 633.

The third and fourth shaft members 631 and 633 support a first link 625 of a front-end link part 620 of two adjacent link parts 620 and a second link 627 of a rear-end link part 620 so as to be connected to each other.

The third shaft member 631 supports the second wing part 425b, which is provided at the first link 625 of the front-end link part 620, and the third wing part 627b, which is provided at the second link 267 of the rear-end link part 620, so as to be connected to each other, and moves by a length of the third slot S3 according to the guide of the third slot S3. That is, the third shaft member 631 is inserted into the third slot S3, which is provided at the third wing part 627b of the rear-end link part 620, and the first hole H1 which is provided at the second wing part 625b of the front-end link part 620, and rotatably supports the first link 625 of the front-end link part 620 and the second link 627 of the rear-end link part 620. The third shaft member 631 may be configured with a supporting pin, a rivet, or a bolt and a nut.

The fourth shaft member 633 is inserted into the fourth slot S4, which is provided at the third wing part 627b of the rear-end link part 620, and the second hole H2 which is provided at the second wing part 625b of the front-end link part 620, supports the first link 625 of the front-end link part 620 and the second link 627 of the rear-end link part 620, and moves by a length of the fourth slot S4 according to the guide of the fourth slot S4. Therefore, the second link 627 of each link part 620 rotates with the third shaft member 631 as a rotation axis, and a maximum rotation angle is limited by the fourth shaft member 633 inserted into the fourth slot S4. Also, the fourth shaft member 633 rotates a corresponding bending guide member 610 according to rotation of the second link 627, and simultaneously moves the corresponding bending guide member 610 by a length of the fourth slot S4. The fourth shaft member 633 may be configured with a supporting pin, a rivet, or a bolt and a nut.

As described above, each of the plurality of link connecting members 630 is connected between the plurality of link parts 620, and thus, the first and second links 625 and 627 of each of the plurality of link parts 620 are connected to each other through each of the first to fourth shaft members 621, 623, 631 and 633 in a crossing type (or a chain type).

The first link coupling part 640 is connected to a first link part 620 adjacent to the first housing 200 among the plurality of link parts 620, and is coupled to the first housing 200. That is, one side of the first link coupling part 640 is coupled to the first housing 200, and the other side of the first link coupling part 640 is rotatably connected to the third wing part 627b which is provided at the second link 627 of the first link part 620. The first link coupling part 640 according to an embodiment includes a first coupling body 641, a fifth wing part 643, and a first link supporting member 645.

The first coupling body 641 is coupled to the first housing 200 which contacts the link assembly 600. For example, the first coupling body 641 may be coupled to inner both edges of the first rear cover 220, which contacts the link assembly 600, by a coupling member such as a screw, but the present embodiment is not limited thereto. As another example, the first coupling body 641 may be coupled to an inner wall of the first panel supporting part 210 which contacts the link assembly 600.

The fifth wing part 643 protrudes from an inner side of the first coupling body 641 to the first link part 620 with respect to the length direction X of the display panel 100, and is connected to the second link 627 of the first link part 620 through the first link supporting member 645. The fifth wing part 643 includes a fifth hole H5 and a sixth hole H6 into which the first link supporting member 645 is inserted. In addition, an inner side of the fifth wing part 643 may be inclined identically to the second link body 627a.

The first link supporting member 645 connects and supports the fifth wing part 643 and the second link 627 of the first link part 620, and includes fifth and sixth shaft members 645a and 645b.

The fifth shaft member 645a supports the fifth wing part 643 and the second link 627 of the first link part 620 so as to be connected to each other. That is, the fifth shaft member 645a is inserted into the third slot S3 of the third wing part 627b, which is provided at the second link 627 of the first link part 620, and the fifth hole H5 which is provided at the fifth wing part 643, and rotatably supports the fifth wing part 643 and the third wing part 627b of the second link 627. The fifth shaft member 645a may be configured with a supporting pin, a rivet, or a bolt and a nut.

The sixth shaft member 645b supports the fifth wing part 643 and the second link 627 of the first link part 620 so as to be connected to each other. That is, the sixth shaft member 645b is inserted into the fourth slot S4 of the third wing part 627b, which is provided at the second link 627 of the first link part 620, and the sixth hole H6 which is provided at the fifth wing part 643, and rotatably supports the fifth wing part 643 and the third wing part 627b of the second link 627. The sixth shaft member 645b may be configured with a supporting pin, a rivet, or a bolt and a nut.

The second link coupling part 650 is connected to a last link part 620 adjacent to the second housing 300 among the plurality of the link parts 620, and is coupled to the second housing 300. That is, one side of the second link coupling part 650 is coupled to the second housing 300, and the other side of the second link coupling part 650 is rotatably connected to the second wing part 625c which is provided at the first link 625 of the last link part 620. The second link coupling part 650 according to an embodiment includes a second coupling body 651, a sixth wing part 653, and a second link supporting member 655.

The second coupling body 651 is coupled to the second housing 300 which contacts the link assembly 600. For example, the second coupling body 651 may be coupled to inner both edges of the second rear cover 320, which contacts the link assembly 600, by a coupling member such as a screw, but the present embodiment is not limited thereto. As another example, the second coupling body 651 may be coupled to an inner wall of the second panel supporting part 310 which contacts the link assembly 600.

The sixth wing part 653 protrudes from an inner side of the second coupling body 651 to the last link part 620 with respect to the length direction X of the display panel 100, and is connected to the second link 627 of the last link part 620 through the second link supporting member 655. The sixth wing part 653 includes fifth and sixth slots S5 and S6 into which the second link supporting member 655 is inserted. The fifth and sixth slots S5 and S6 may be provided in a curved shape having a curvature based on a rotation angle of the first link 625, so that the first link 625 rotates at a certain angle in bending the display panel 100. In this case, lengths of the fifth and sixth slots S5 and S6 differ based on a rotation angle of the first link 625, and the fifth slot S5 may be shorter in length than the sixth slot S6. Particularly, in order to maintain a bending curvature of the display panel 100 which is bent by the outer bending manner, the length of each of the fifth and sixth slots S5 and S6 may be the same as a half of a slot which is provided at each of the links 625 and 627.

The second link supporting member 655 connects and supports the sixth wing part 653 and the first link 625 of the last link part 620, and includes seventh and eighth shaft members 655a and 655b.

The seventh shaft member 655a supports the sixth wing part 653 and the first link 625 of the last link part 620 so as to be connected to each other, and moves by a length of the fifth slot S5 according to the guide of the fifth slot S5. That is, the seventh shaft member 655a passes through the fifth slot S5 of the sixth wing part 653, is inserted into the first hole H1 of the second wing part 625c which is provided at the first link 625 of the last link part 620, and rotatably supports the sixth wing part 653 and the second wing part 625c of the first link 625. The seventh shaft member 655a may be configured with a supporting pin, a rivet, or a bolt and a nut.

The eighth shaft member 655b supports the sixth wing part 653 and the first link 625 of the last link part 620 so as to be connected to each other, and moves by a length of the sixth slot S6 according to the guide of the sixth slot S6. That is, the eighth shaft member 655b passes through the sixth slot S6 of the sixth wing part 653, is inserted into the second hole H2 of the second wing part 625c which is provided at the first link 625 of the last link part 620, and rotatably supports the sixth wing part 653 and the second wing part 625c of the first link 625. The eighth shaft member 655b may be configured with a supporting pin, a rivet, or a bolt and a nut.

In the link assembly 600, a shaft member which supports each of the links 625 and 627 restrictively moves by a length of each of the slots S1 to S6 according to the display panel 100 being folded or unfolded, and thus, each bending guide member 610 moves while rotating, and is unfolded to a plane state or is folded at a certain curvature.

That is, in each bending guide member 610 of the link assembly 600, when the display panel 100 is unfolded to a plane state as illustrated in FIG. 1, the links 625 and 627 overlaps each other to be crossed according to moving of a shaft member, and thus are unfolded to the plane state, thereby allowing the bending area 115 of the display panel 100 to be unfolded to the plane state. Also, in each bending guide member 610 of the link assembly 600, as illustrated in FIG. 7, when the display panel 100 is bent in the outer bending manner, the links 625 and 627 overlap each other to be crossed according to moving of the shaft member, and thus are outer-bent at a certain curvature, thereby allowing the bending area 115 of the display panel 100 to be bent at a certain curvature.

Therefore, in the link assembly 600, when the display panel 100 is folded and unfolded, the links 625 and 627 overlaps each other to be crossed or is expanded and moved, and thus, each bending guide member 610 rotates, thereby compensating for a length change of the bending area 115 of the display panel 100. Therefore, a bending stress applied to the bending area 115 of the display panel 100 is minimized, thereby enhancing a reliability of the display panel 100.

In the second embodiment of the present invention, since the display area 110 of the folded display panel 100 is exposed to the outside, the first area 111, second area 113, and bending area 115 of the display panel 100 provide different screens even in a folded state. For example, when the display panel 100 is folded, an image may not be displayed in the first and second areas 111 and 113, or the same image or different images may be simultaneously or selectively displayed. Particularly, in the folded display panel 100, the bending area 115 may be used as a sub-screen, in which case a sub-image for a user interface may be displayed in the bending area 115. Here, the sub-image may be system setting information, the balance of a battery, a sensitivity of wireless communication, time information, and a message reception icon.

A display apparatus using a flat display panel, such as a liquid crystal display (LCD) apparatus, a plasma display apparatus, an organic light emitting display apparatus, an electrophoretic display apparatus, or an electro-wetting display apparatus, is generally applied to notebook computers, portable electronic devices, televisions (TVs), and monitors.

The present invention supports the bending area of the display panel by using the link assembly which is unfolded to a plane state or is bent at a certain curvature, and thus has the following effects.

First, a bending curvature of a folded display panel is stably maintained, and a bending area of an unfolded display panel is maintained in a plane state.

Second, a length change of the bending area of the display panel is compensated for in folding and unfolding the display panel, and thus, a bending stress applied to the bending area of the display panel is minimized, thereby enhancing a reliability of the display panel.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A foldable display apparatus comprising:
 a display panel configured to include a display area which includes a first area, a second area, and a bending area, and folded or unfolded with respect to the bending area;
 a first housing configured to support the first area of the display panel;
 a second housing configured to support the second area of the display panel; and a link assembly connected between the first and second housings to support the bending area, and configured to guide bending of the bending area, wherein the link assembly comprises:

a plurality of bending guide members configured to support the bending area;

a plurality of link parts connected to both ends of each of the plurality of bending guide members;

a plurality of link connecting members respectively provided between the plurality of link parts, and configured to connect two adjacent link parts;

a first link coupling part configured to couple a first link part of the plurality of link parts to the first housing; and a second link coupling part connected to a last link part of the plurality of link parts, and coupled to the second housing, wherein each of the plurality of link parts comprises:

a first shaft member and a second shaft member coupled to a side of a corresponding bending guide member to be adjacent to each other;

a first link supported by the first and second shaft members; and a second link supported by the first and second shaft members to cross the first link, and wherein each of the first and second links rotates with the first shaft member as a rotation axis.

2. The foldable display apparatus of claim 1, wherein, the first link comprises:

a first link body;

a first wing part configured to protrude in a first direction from the first link body to be parallel to the side of the corresponding bending guide member; and a second wing part configured to protrude in a second direction, which is opposite to the first direction, from the first link body to be parallel to the side of the corresponding bending guide member, and each of the first and second shaft members passes through the first wing part, and is coupled to the corresponding bending guide member.

3. The foldable display apparatus of claim 2, wherein, the second link comprises:

a second link body;

a third wing part configured to protrude in the first direction from the second link body to be parallel to the first wing part; and a fourth wing part configured to protrude in the second direction from the second link body to overlap the first wing part in parallel with the first wing part, and each of the first and second shaft members passes through the fourth wing part and the first wing part, and is coupled to the corresponding bending guide member.

4. The foldable display apparatus of claim 3, wherein, each of the plurality of link connecting members comprises a third shaft member and a fourth shaft member;

the third and fourth shaft members connect and support a second link of a front-end link part of two adjacent link parts and a first link of a rear-end link part of the two adjacent link parts, and the second link of the front-end link part and the first link of the rear-end link part rotate with the third shaft member as a rotation axis.

5. The foldable display apparatus of claim 4, wherein each of the plurality of link parts comprises:

a first slot provided at the first wing part of the first link, and configured to guide moving of the second shaft member; and a second slot provided at the third wing part of the second link, and configured to guide moving of the fourth shaft member.

6. The foldable display apparatus of claim 4, wherein each of the plurality of link parts comprises:

a first slot provided at the first wing part of the first link, and configured to guide moving of the first shaft member;

a second slot provided at the first wing part of the first link to be adjacent to the first slot, and configured to have a longer length than the first slot and guide moving of the second shaft member;

a third slot provided at the third wing part of the second link, and configured to guide moving of the third shaft member; and a fourth slot provided at the third wing part of the second link to be adjacent to the third slot, and configured to have a longer length than the third slot and guide moving of the fourth shaft member.

7. The foldable display apparatus of claim 6, wherein, each of the first and second link bodies is provided to be inclined along a first slope direction, and an outer side of each of the first to fourth wing parts is provided to be inclined along the first slope direction.

8. The foldable display apparatus of claim 6, further comprising a panel protecting member provided between the link assembly and the display panel.

9. The foldable display apparatus of claim 8, wherein the panel protecting member is attached to one of the plurality of bending guide members.

10. The foldable display apparatus of claim 3, wherein, each of the first and second link bodies is provided to be inclined along a first slope direction, an outer side of each of the first and third wing parts is provided to be inclined along a second slope direction intersecting the first slope direction, and an outer side of each of the second and fourth wing parts is provided to be inclined along the first slope direction.

11. The foldable display apparatus of claim 1, further comprising a panel protecting member provided between the link assembly and the display panel.

12. The foldable display apparatus of claim 11, wherein the panel protecting member is attached to one of the plurality of bending guide members.

13. The foldable display apparatus of claim 1, wherein the display panel is bent in a direction, where the first area directly faces the second area, with respect to the bending area according to rotation of each of the plurality of link parts.

14. The foldable display apparatus of claim 1, wherein the display panel is bent in a direction, where the first area does not directly face the second area, with respect to the bending area according to rotation of each of the plurality of link parts.

15. The foldable display apparatus of claim 1, wherein the first housing is attached to a rear surface of the first area of the display panel by an adhesive member.

16. The foldable display apparatus of claim 15, wherein the second housing is attached to a rear surface of the second area of the display panel by an adhesive member.

17. The foldable display apparatus of claim 1, further comprising a flexible supporting plate attached to an entire rear surface of the display panel.

18. The foldable display apparatus of claim 1, wherein the display panel is a flexible organic light emitting display panel.

* * * * *